United States Patent [19]

Okumura

[11] Patent Number: 5,300,449
[45] Date of Patent: Apr. 5, 1994

[54] ACTIVE MATRIX SUBSTRATE FOR LIQUID-CRYSTAL DISPLAY AND METHOD OF FABRICATING THE ACTIVE MATRIX SUBSTRATE

[75] Inventor: Fujio Okumura, Tokyo, Japan

[73] Assignee: NEC Corporation, Japan

[21] Appl. No.: 963,387

[22] Filed: Oct. 16, 1992

Related U.S. Application Data

[62] Division of Ser. No. 570,382, Aug. 21, 1990, Pat. No. 5,191,453.

[30] Foreign Application Priority Data

Aug. 23, 1989 [JP] Japan .................................. 1-217913

[51] Int. Cl.⁵ .......................................... H01L 21/265
[52] U.S. Cl. ........................................ 437/48; 437/40; 437/41; 437/192; 437/200; 359/59; 359/87
[58] Field of Search ................... 437/48, 49, 192, 260, 437/40, 41; 359/54, 58, 59; 340/784; 350/333, 334, 336, 342

[56] References Cited

U.S. PATENT DOCUMENTS

| | | | |
|---|---|---|---|
| 4,181,913 | 1/1980 | Thornburg | 357/4 |
| 4,646,424 | 3/1987 | Parks et al. | 437/48 |
| 4,697,331 | 10/1987 | Boulitrop et al. | 359/59 |
| 4,738,749 | 4/1988 | Maurice et al. | 350/333 X |
| 4,878,097 | 10/1989 | Yamazaki | 357/2 |
| 4,929,059 | 5/1990 | Takahashi | 350/334 |
| 4,985,372 | 1/1991 | Narita | 437/142 |
| 4,999,693 | 3/1991 | Yamazaki et al. | 357/4 |
| 5,008,218 | 4/1991 | Kawachti et al. | 437/200 |
| 5,028,551 | 7/1991 | Pohjo et al. | 437/41 |
| 5,120,667 | 6/1992 | Tarui et al. | 437/40 |
| 5,153,142 | 10/1992 | Hsieh | 437/181 |
| 5,166,085 | 11/1992 | Wakai et al. | 437/40 |

OTHER PUBLICATIONS

"Polycrystalline Silicon Liquid LCDs with High-Speed Integrated Scanners", Stewart, et al, SID 88 Digest, pp. 404-405.

"A ⅜ Inch Fully Integrated Active-Matrix LCD With Thin Mesh Polysilicon Electrodes", Yamamoto, et al, IEEE 1989; pp. 161-164.

*Society For Information Display Internation Symposium Digest of Technical Papers vol. XIX,* "9.5-in. Poly-Si TFT-LCD with New Transistor Configuration", Ohshima, et al SID 88 Digest, pp. V and 408-411.

*Primary Examiner*—Brian E. Hearn
*Assistant Examiner*—Kevin M. Picardat
*Attorney, Agent, or Firm*—Laff, Whitesel, Conte & Saret

[57] ABSTRACT

In an active matrix substrate for a liquid-crystal display, a plurality of individual transparent electrodes are arranged in the form of an array, and an array of thin-film transistors is connected to the transparent electrodes for driving the same. Each of the thin-film transistors includes a source region and a drain region which are formed such that impurities are doped at high concentration, an active layer composed of a silicon thin film which is in contact with the source and drain regions and in which at least a part of the silicon thin film covers the source and drain regions, an insulating film which covers the source and drain regions and the active layer, and a gate electrode on the insulating film. Each of the individual transparent electrodes is composed of a silicon thin film contiguous to the active layer of the thin-film transistor and a metal silicide on the silicon thin film. In the active matrix substrate, metal silicide is formed, in the form of an island, onto the silicon thin film on the entire surface of which the individual transparent electrodes are formed. The active matrix substrate of the invention does not use a transparent conductive film made of indium as indium tin oxide and oxide of tin. A pair of drain regions may be so formed as to electrically shield the source region. A method of fabricating the active matrix substrate is also disclosed.

2 Claims, 8 Drawing Sheets

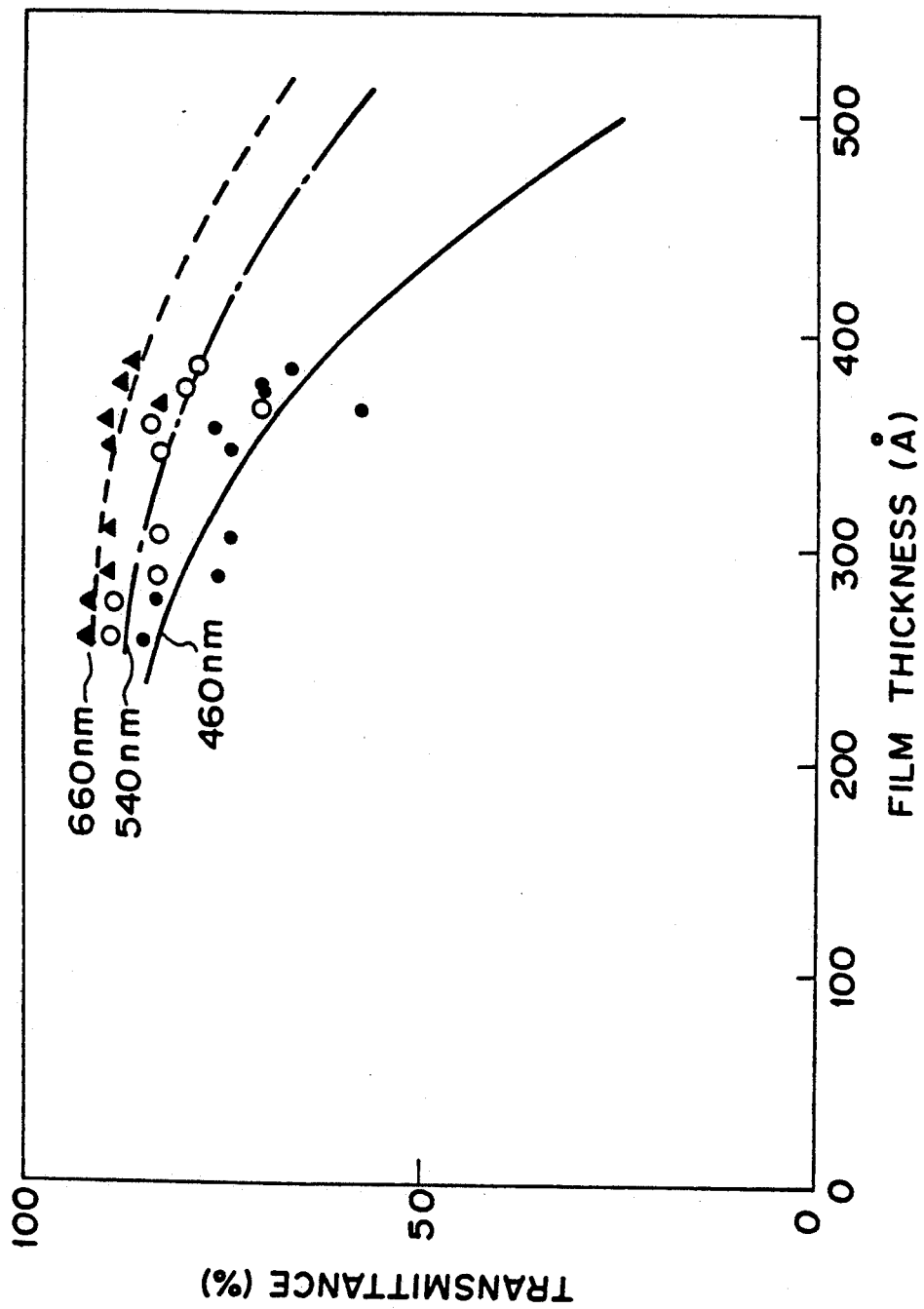

ACTIVE MATRIX SUBSTRATE FOR LIQUID-CRYSTAL DISPLAY AND METHOD OF FABRICATING THE ACTIVE MATRIX SUBSTRATE

This application is a division, of prior application Ser. No. 07/570,382, filed Aug. 21, 1990 now U.S. Pat. No. 5,191,453.

BACKGROUND OF THE INVENTION

The present invention relates to an active matrix substrate for a liquid-crystal display, which has a thin-film transistor serving as an active element, and a method of fabricating the active matrix substrate.

In recent years, development in an active-matrix type liquid-crystal display has been remarkable with the object being to make a display flat or plane. The active matrix type is such that a thin-film transistor or a thin-film diode of an active element is incorporated as a switching element in each picture element or pixel. The active matrix type is so characterized as to obtain high picture quality, as compared with a so-called simple matrix type in which transparent electrodes are simply intersected with each other.

As a conventional example, an active matrix substrate will be described here in which a thin-film transistor of poly-crystalline silicon is used. FIGS. 6(a) and 6(b) show the conventional example which is disclosed in "SID '88 Digest", H. Ohshima et al., Lecture No. 21.4, pp 408–411. FIG. 6(a) is a top plan view showing one of a plurality of picture elements, while FIG. 6(b) is an enlarged cross-sectional view taken along the line VI(b)-VI(b) in FIG. 6(a).

The conventional active matrix substrate comprises a glass substrate 1 and a pair of source and drain regions 3 and 2 on the glass substrate 1. The source and drain regions 3 and 2 are composed of poly-crystalline silicon in which phosphorus is doped at high concentration. An active layer 4 composed of an undoped poly-crystalline silicon thin film is provided on the source and drain regions 3 and 2 in contact therewith. The active layer 4 is covered with a gate insulating film 5 made of silicon dioxide. On the gate insulating film 5 there is provided a gate electrode and gate line 6 made of chromium. The gate electrode 6 is covered with an interlayer insulating film 7 made of silicon dioxide. The interlayer insulating film 7 is partly covered with a picture-element electrode 8 which is composed of a transparent conductive element made of indium tin oxide. A drain signal line 9 is provided which is made of aluminum.

An example of a method of fabricating the active matrix substrate is illustrated in FIGS. 7(a) through 7(d) and will next be described in due order.

(1) A poly-crystalline silicon containing a high concentration of phosphorus is formed on a glass substrate by a low-pressure CVD (chemical vapor deposition) process which uses phosphine ($PH_3$) and silane ($SiH_4$) as raw-material gas. The poly-crystalline silicon is patterned to form the source region 3 and the drain region 2. Subsequently, silane is decomposed similarly by the low-pressure CVD process to form a poly-crystalline silicon thin film on the source and drain regions 3 and 2. The poly-crystalline silicon thin film is patterned in the form of an island to form the active layer 4.

(2) The gate insulating film 5 consisting of a silicon dioxide film is formed on the active layer 4 by a CVD process which uses silane and oxygen as raw-material gas. Chromium is formed on the gate insulating film 5 by means of sputtering and is subsequently patterned to form the gate electrode 6.

(3) The interlayer insulating film 7 consisting of silicon dioxide is formed on the gate electrode 6 again by means of the CVD process. A pair of contact holes to the respective source and drain regions 3 and 2 are formed in the silicon dioxide films 5 and 7.

(4) Lastly, the drain line 9 made of aluminum and the picture-element electrode 8 made of indium tin oxide are formed into their respective films by means of a sputtering process or a vacuum deposition process and, subsequently, are patterned into their respective desired configurations. Thus, the fabricating method is completed.

The above-described construction and fabricating method have various problems caused by the use of the indium tin oxide. First, inferiority in etching of the indium tin oxide can be given. That is, the indium tin oxide has the following problems. Although superior in nature as a transparent conductive film, the indium tin oxide involves difficulties in dry etching, is not so good in processing accuracy at wet etching, and so on. For this reason, it is necessary to take a sufficient space more than 5 $\mu$m between the line and the individual transparent electrode made of indium tin oxide. This space becomes one of causes which reduce the area of the transmitting section of a light. Secondly, there is such a problem that etchant for the wet etching etches also aluminum. Accordingly, in the case where the indium tin oxide and the aluminum line are on the same or identical plane as in this example, a very high etching technique is required. Thirdly, there is such a problem that the indium tin oxide is apt to be damaged by hydrogen plasma. Although it is necessary to decrease the trap density in grain boundary as a necessity peculiar to the poly-crystalline silicon, the hydrogen plasma treatment is a technique which is often used. In this construction, however, since the indium tin oxide forms the uppermost layer, it is difficult to improve the transistor characteristic by use of the hydrogen plasma treatment at the last step. As another problem, the involvement of a number of the fabricating steps can be given. In this example, six (6) masks are used. The large number of the steps causes reduction of the yield.

SUMMARY OF THE INVENTION

It is an object of the invention to provide an active matrix substrate for a liquid-crystal display, which solves the above-discussed disadvantages of the prior art, which has no problem caused by indium tin oxide, which is simple in construction and which is less in fabricating steps.

It is another object of the invention to provide a method of fabricating the above-described active matrix substrate.

According to the invention, there is provided an active matrix substrate for a liquid-crystal display comprising:

a substrate;

a plurality of pixel electrodes formed on the substrate in a matrix form, each of the pixel electrodes having a first silicon thin film and a metal silicide film formed on the first silicon thin film; and a plurality of thin-film transistors formed on the substrate and connected to the pixel electrodes, respectively, each of the thin-film transistors having a second silicon thin film continuous with the first silicon thin film, a gate electrode formed on one of an upper surface and a lower surface of a portion of the second thin film, and a source and drain regions formed at both sides of the gate electrode, the source and drain regions being connected to the portion of the second thin film, and one of the source and drain regions being electrically connected to the pixel electrode.

According to the invention, there is further provided an active matrix substrate for a liquid-crystal display comprising a plurality of individual transparent electrodes arranged in the form of an array, and an array of thin-film transistors connected to the transparent electrodes for driving the same, each of the thin-film transistors including:

a source region and a drain region which are formed such that impurities are doped at high concentration;

an active layer composed of a silicon thin film which is in contact with the source and drain regions and in which at least a part of the silicon thin film covers the source and drain regions;

an insulating film which covers the source and drain regions and the active layer; and a gate electrode on the insulating film, wherein each of the individual transparent electrodes is composed of a silicon thin film contiguous to the active layer of the thin-film transistor and a metal silicide on the silicon thin film.

According to the invention, there is still further provided an active matrix substrate for a liquid-crystal display, the active matrix substrate comprising a plurality of individual transparent electrodes arranged in the form of an array, and an array of thin-film transistors connected to the transparent electrodes for driving the same, each of the thin-film transistors including:

a source region formed such that impurities are doped at high concentration;

a drain region formed in such a configuration as to electrically shield the source region;

an active layer composed of a silicon thin film which is in contact with the source and drain regions and in which at least a part of the silicon thin film covers the source and drain regions;

an insulating film which covers the source and drain regions and the active layer; and a gate electrode on the insulating film, wherein each of the individual transparent electrodes is composed of a silicon thin film formed on the entire surface of the substrate and a metallic silicide on the silicon thin film formed in the form of an array.

According to the invention, there is still further provided a method of fabricating an active matrix substrate for a liquid-crystal display, the method comprising the steps of:

forming a first silicon film in which impurities high in concentration are doped onto a transparent substrate, and patterning the first silicon thin film into source and drain regions and configurations of connection portions at intersected sections of lines;

forming a second silicon thin film on the source and drain regions and the connection portions, and patterning the second silicon thin film into island regions in contact with at least the source and drain regions and an island region contiguous to the island regions, which is slightly larger than the configuration of an individual transparent electrode;

forming an insulating film on the second silicon thin film;

forming a pair of holes in the insulating film, for being in contact with the source and drain regions, and a hole identical with the configuration of the individual transparent electrode, on the second silicon thin film which is patterned into the island region slightly larger than the individual transparent electrode;

forming metal on the second silicon thin film, the metal reacting at least with silicon to form silicide;

heat-treating the metal to form the silicide; and patterning the metal to form lines for a gate, and the source and drain regions.

According to the invention, there is also provided a method of fabricating an active matrix substrate for a liquid-crystal display, the method comprising the steps of:

forming a first silicon thin film in which impurities high in concentration are doped onto a transparent substrate, and patterning the first silicon thin film into source and drain regions and configurations of connection portions at intersected sections of lines;

forming a second silicon thin film on the source and drain regions and the connection portions;

forming an insulating film on the second silicon thin film;

forming a pair of holes in the insulating film, for being in contact with the source and drain regions, and a hole identical with the configuration of an individual transparent electrode;

forming metal on the second silicon thin film, the metal reacting at least with silicon to form silicide;

heat-treating the metal to form the silicide; and patterning the metal to form lines for a gate, and the source and drain regions.

The active matrix substrate for the liquid-crystal display according to the invention forms the individual transparent electrode by the silicon thin film and the metal silicide thereon without the use of indium tin oxide. The processing accuracy of the silicon thin film is higher by one figure than the indium tin oxide, and it is unnecessary to take much margin between the line and the individual transparent electrode. As a result, it is possible to increase the aperture ratio more than the conventional one. Further, there is no problem in selection of etching with respect to aluminum, and there is no problem of damage caused by the hydrogen plasma treatment.

Furthermore, since the silicon thin film of the individual transparent electrode and the active layer of the driving thin-film transistor are formed in contiguous to each other, the construction is made simple. For this reason, it is possible to form together the active layer of the thin-film transistor and the individual transparent electrode section. Thus, it is possible to reduce the fabricating steps.

Moreover, the active layer of the thin-film transistor and the silicon thin film of the individual transparent electrode section may be formed on the entire surface of the substrate without being patterned. In this case, if the source region is so formed as to be electrically shielded by the drain region, it is possible to block leak current from the drain line for other picture elements or pixels. Since, in such construction, the patterning step of the silicon thin film can be dispensed with, there is obtained such an advantage that the fabricating steps can further be simplified.

In the case where the silicon thin film containing silicide is used as the transparent electrode, light transmittance becomes a problem. The transmittance relies upon the film thickness. In the case of the poly-crystalline silicon film, the film thickness in the order of 300 Å indicates 75% or more of the light transmittance. Thus, the thin film can sufficiently withstand practical use. As an example, the relationship between the transmittance and the film thickness of the poly-crystalline silicon film was measured on lights whose respective wavelengths are 460 nm, 540 nm and 660 nm. The measurement results are shown in FIG. 8. Since a single-crystalline silicon film is higher in transmittance than the poly-crystalline silicon film, it is possible to use the thickness in the order of 1,000 Å. Further, since an amorphous silicon film is low in transmittance, it is desirable to use the amorphous silicon film with its film thickness of the order of 100 Å to 200 Å.

In order to increase the transmittance beyond 60% at the wavelength of 400 nm–700 nm, it is required for the film thickness to be:

Less than 1000 Å in single-crystalline silicon film,
Less than 400 Å in poly-crystalline silicon film, and
Less than 200 Å in amorphous silicon film.

Therefore, the thickness of the film at its silicon film formation and the thickness of the film after its silicide formation (50 Å in thickness) may be as follows:

|  | Silicon film | After silicide formation |
| --- | --- | --- |
| Single-crystalline | 150–1050 Å | 100–1000 Å |
| Poly-crystalline | 150–450 Å | 100–400 Å |
| Amorphous | 150–250 Å | 100–100 Å |

Here, since the silicide film is extremely thin, e.g. 20–50 Å, the silicide film absorbs light very little, and the light is transmitted through the silicide film. Thus, there is no problem. Furthermore, although the silicon thin film is extremely large in resistance, the use of the silicide film enables the sheet resistance to be reduced relatively to a few kΩ. This value is sufficient for the transparent electrodes for picture elements (pixels).

As will be seen from the above-described construction, the active matrix substrate for the liquid-crystal display, according to the invention, does not use a transparent conductive film made of indium such as indium tin oxide and oxide of tin. Accordingly, no problem caused by the transparent conductive film occurs, unlike in the conventional substrate. In the invention, a window is formed in the silicon dioxide film to form the silicide in the polycrystalline silicon film. As known well at present, the silicon and the silicon dioxide are high in processing accuracy, and it is possible to dry-etch the silicon and the silicon dioxide at the order of submicron. There is not any problem in application of the kind referred to above. The processing accuracy of the silicon and the silicon dioxide is accurate by more than one figure with respect to the processing accuracy of the indium tin oxide. Further, since the silicon and the silicon dioxide are wholly different in etchant from aluminum, there occurs no problem in the use of the aluminum, the etching condition and so on. Furthermore, deterioration caused by the hydrogen plasma does not appear at all in the silicon and the silicon dioxide.

The next important factor is the number of steps. Conventionally, six (6) or seven (7) masks are required to be used. However, the number of the masks is reduced to three (3) or four (4) in the invention. Thus, the number of steps is reduced approximately to half. The reduction in the number of steps improves the yield, and is useful in sharp reduction of the manufacturing cost.

BRIEF DESCRIPTION OF THE DRAWINGS

The above and other objects, features and advantages of the present invention will be apparent from the following description of preferred embodiments of the invention explained with reference to the accompanying drawings, in which:

FIG. 8 is a graphical representation showing the relationship between the film thickness of a silicon thin film and the transmittance.

DESCRIPTION OF THE PREFERRED EMBODIMENTS

FIRST EMBODIMENT

Figure 1A:
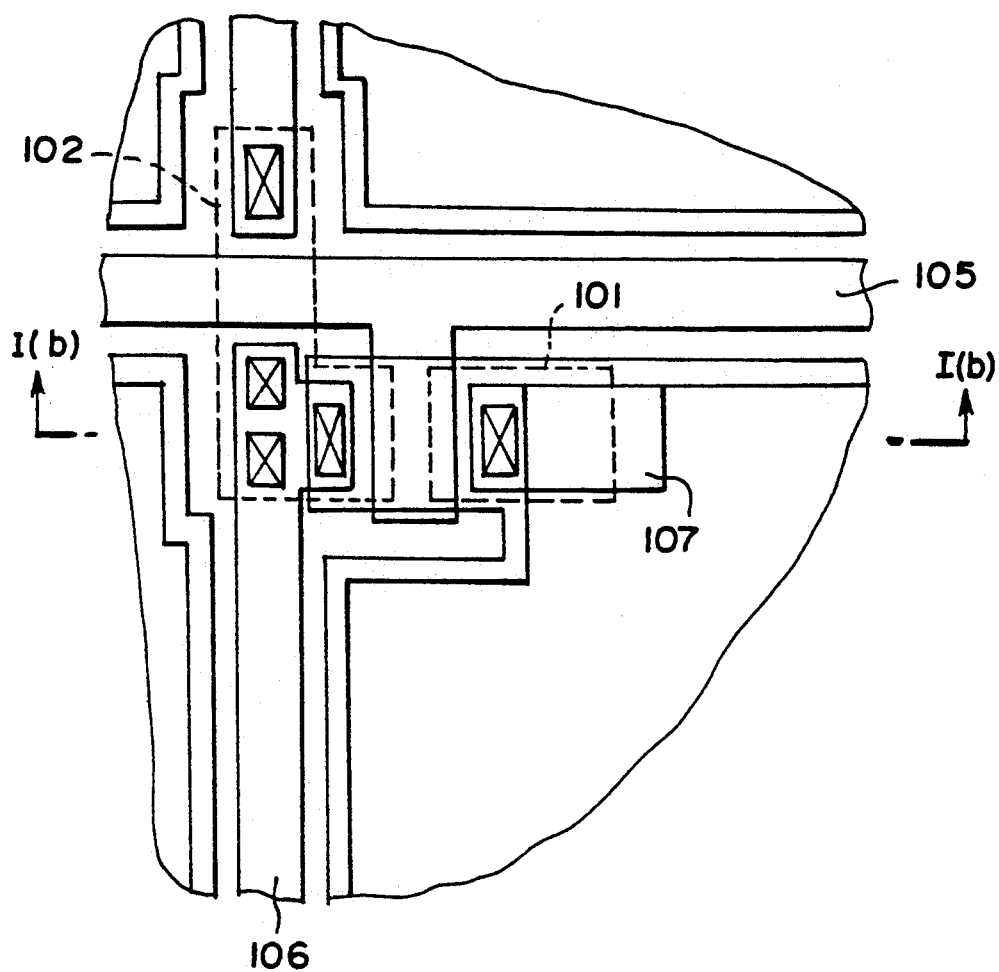
FIG. 1(a) is an enlarged fragmentary top plan view of an active matrix substrate for a liquid-crystal display, according to a first embodiment of the invention.
Figure 1B:
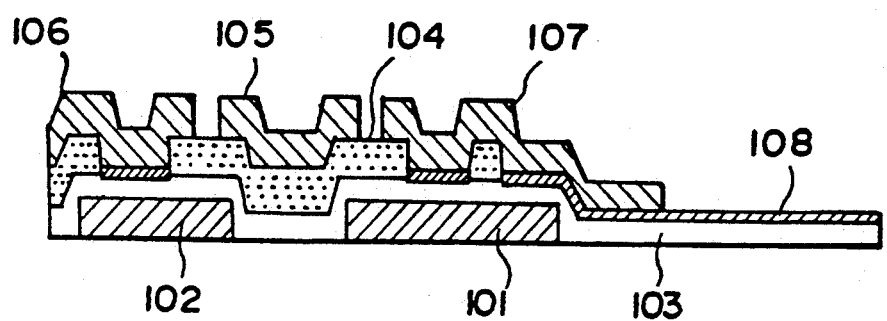
FIG. 1(b) is a cross-sectional view taken along the line I(b)—I(b) in FIG. 1(a)
Figure 2A:
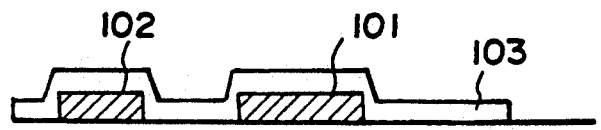
FIGS. 2(a) through 2(e) are views showing a fabrication method according to the first embodiment of the invention.
Figure 2B:
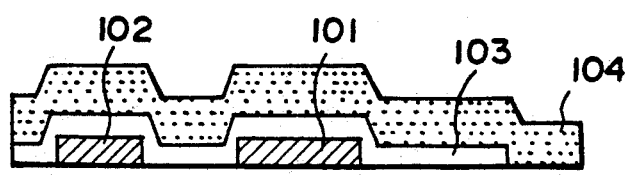
Figure 2C:
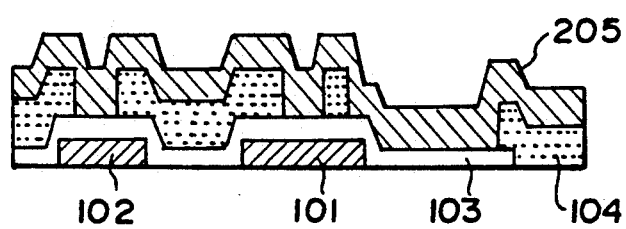
Figure 2D:
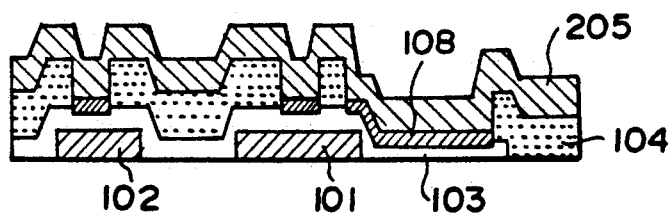
Figure 2E:
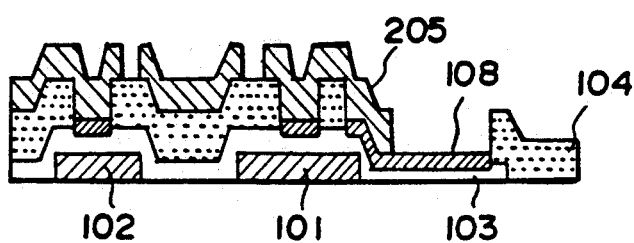

Referring first to FIGS. 1(a) and 1(b), there is shown, in top plan and cross-sectional views, an active matrix substrate for a liquid-crystal display, according to a first embodiment of the invention. The active matrix substrate comprises a pair of source and drain regions 101 and 102 each of which is made of a poly-crystalline silicon film in which phosphorus is doped at high concentration. The source and drain regions 101 and 102 are covered with an active layer 103 which is made of a poly-crystalline silicon film and whose thickness is, for example, 300 Å. As to the film thickness of the active layer 103 in a thin-film transistor, it is required that the film be within the minimum of 50–100 Å. The active layer 103 is covered with a gate insulating film 104 which is made of a silicon dioxide film. The gate insulating film 104 is covered with a gate electrode and gate line 105, a drain electrode and drain line 106, and a source electrode 107, which are all made of chromium.

The active matrix substrate further comprises a chromium silicide film 108 which cooperates with the poly-crystalline silicon film (the active layer 103) to form an individual transparent electrode. The metal silicide film is formed of a member selected from a group consisting of chromium silicide, molybdenum silicide, nickel silicide and platinum silicide and compounds thereof. The preferable film thickness of such metal silicide film is within 20–100 Å with 20 Å being the lower limit for the formation of silicide. Above 100 Å, it becomes difficult to obtain sufficient transmittance for transparent electrodes. Indium tin oxide is not used at all in the active matrix substrate according to the invention.

A method of fabricating the active matrix substrate for the liquid-crystal display, according to the first embodiment of the invention, will next be described with reference to FIGS. 2(a) through 2(e).

(A) A poly-crystalline silicon containing a high concentration of phosphorus is formed on a glass substrate by a low-pressure CVD (chemical vapor deposition) process which uses phosphine ($PH_3$) and silane ($SiH_4$) as raw-material gas. The poly-crystalline silicon is patterned to form the source region 101 and the drain region 102. Subsequently, silane is decomposed similarly by the low-pressure CVD process to form a poly-crystalline silicon thin film on the source and drain regions 101 and 102, to form the active layer 103. The active layer 103 is then patterned.

(B) The active layer 103 is covered with the gate insulating film 104 consisting of a silicon dioxide film by a CVD process which uses silane and oxygen as raw-material gas.

(C) A pair of contact holes are formed in the silicon dioxide film 104, and chromium 205 is formed by a sputtering process.

(D) The chromium 205 is heat-treated at 200° C. to 300° C. Thus, the chromium silicide layer 108 is formed.

(E) The chromium 205 is patterned into a desirable configuration. Thus, the active matrix substrate is completed.

As will be seen from the foregoing, patterning steps using photomasks are a total of four (4) including the first n-type poly-crystalline silicon, the poly-crystalline silicon of 300 Å, the contact holes to the silicon dioxide, and the patterning of chromium.

Second Embodiment

Figure 3A:
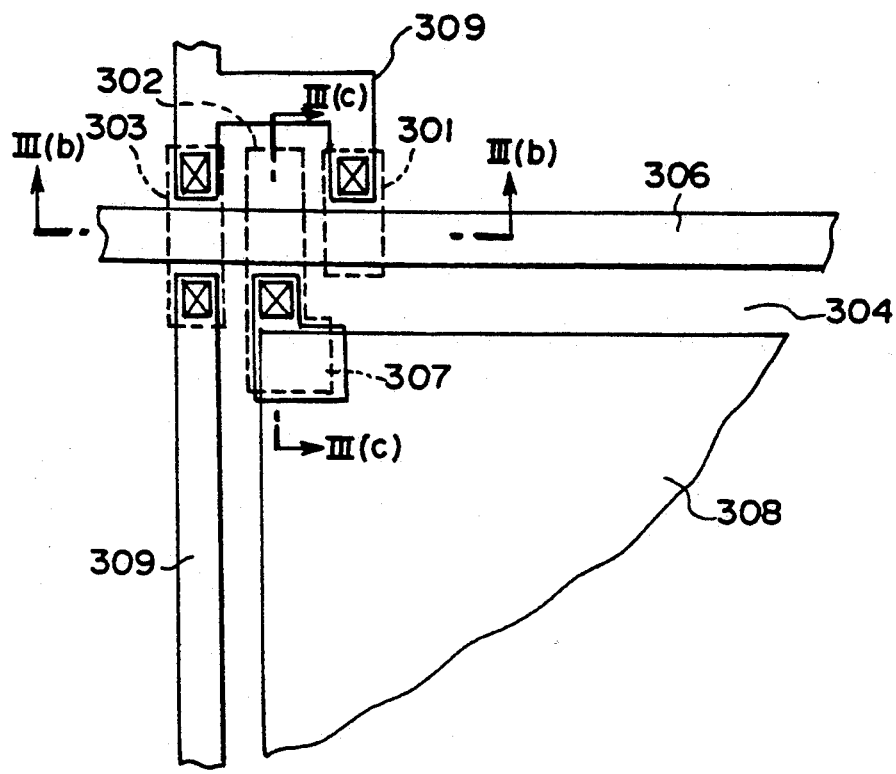
FIG. 3(a) is an enlarged fragmentary top plan view of an active matrix substrate for a liquid-crystal display, according to a second embodiment of the invention.
Figure 3B:
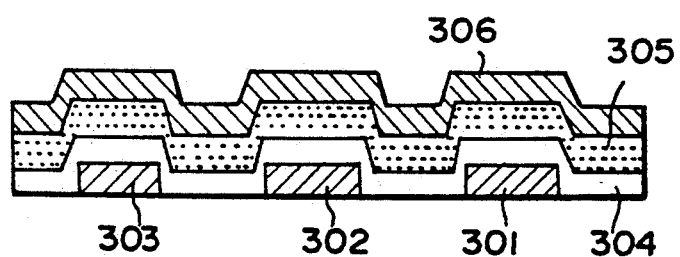
FIG. 3(b) is a cross-sectional view taken along the line III(b)—III(b) in FIG. 3(a)
Figure 3C:
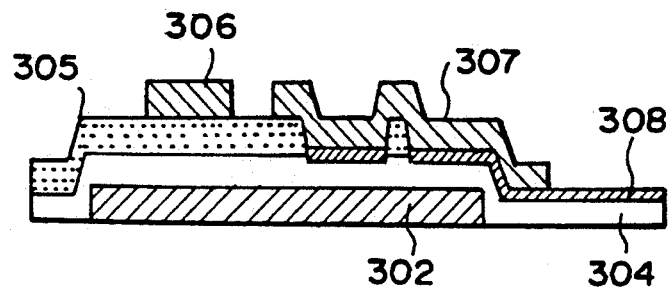
FIG. 3(c) is a cross-sectional view taken along the line III(c)—III(c) in FIG. 3(a)
Figure 4A:
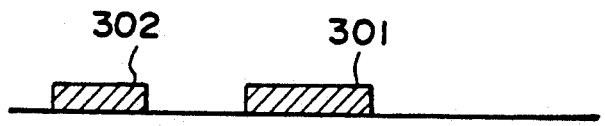
FIGS. 4(a) through 4(e) are views showing a fabrication method according to the second embodiment of the invention.
Figure 4B:
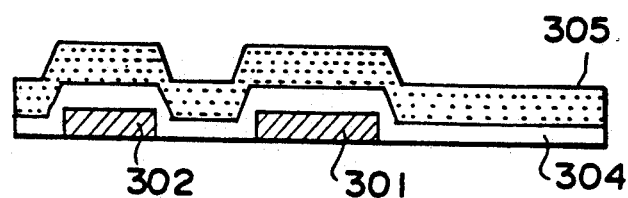
Figure 4C:
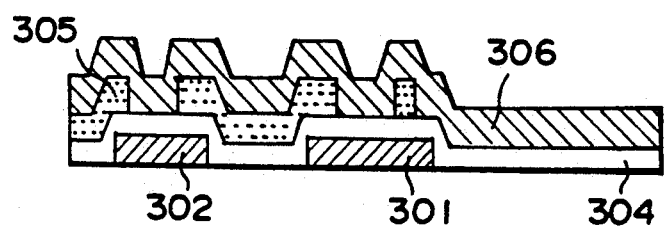
Figure 4D:
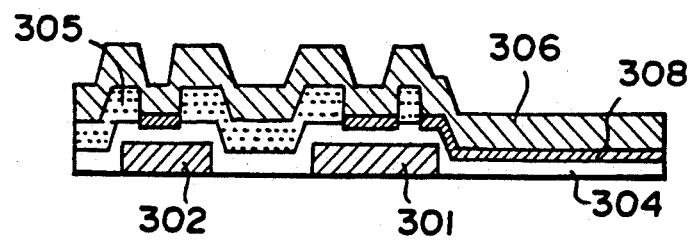
Figure 4E:
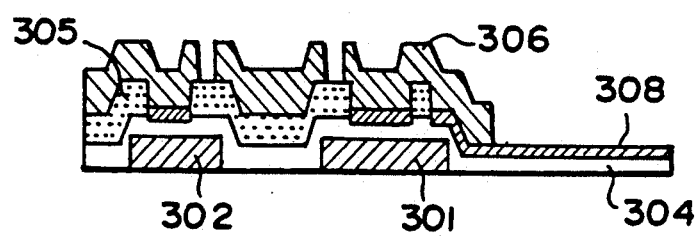

Referring next to FIGS. 3(a) through 3(c), there is shown, in top plan and cross-sectional views, an active matrix substrate for a liquid-crystal display, according to a second embodiment of the invention. The active matrix substrate of this embodiment comprises a shield drain region 301, a source region 302 and a drain region 303 each of which is made of a poly-crystalline silicon film in which phosphorus is doped at high concentration. The shield drain, source and drain regions 301, 302 and 303 are covered with an active layer 304 which is made of a poly-crystalline silicon film and whose thickness is 300 Å. The active layer 304 is covered with a gate insulating film 305 which is made of a silicon dioxide film. The gate insulating film 305 is covered with a gate electrode and gate line 306 made of chromium. A source electrode 307 is similarly made of chromium. Numeral 308 represents a chromium silicide film. A drain line 309 is also made of chromium. In this construction, the chromium silicide film 308 cooperates with the poly-crystalline silicon film (the active layer 304) of 300 Å to form an individual transparent electrode. Indium tin oxide is not used at all in the active matrix substrate.

In the construction mentioned above, the source region 302 is surrounded by the shield drain region 301 and the drain region 303, and is electrically shielded from other drain regions. Further, the largest steps or level differences in the structure are those which are formed by the respective sections of the shield drain region 301, the source region 302 and the drain region 303, and each of which is of the order of 0.1 $\mu$m to 0.15 $\mu$m. As a point different from the conventional example, it can be said that the poly-crystalline silicon film (the active layer) 304 is not patterned at all. Even if the poly-crystalline silicon film 304 is not patterned, however, there is no problem in characteristic, because the poly-crystalline silicon film is extremely thin. This is because, since the film is extremely thin, electrons serving as carrier can easily pass through it vertically, while electrons are extremely difficult to pass laterally. Particularly, at the section of the contacts, there are diffusion of impurities from the n-type poly-crystalline silicon constituting a foundation at formation of the poly-crystalline film, and reduction in film thickness at formation of the chromium silicide. Thus, even without any gravings, there is obtained an excellent ohmic contact.

A method of fabricating the active matrix substrate for the liquid-crystal display, according to the second embodiment of the invention, will next be described with reference to FIGS. 4(a) through 4(e).

(A) A poly-crystalline silicon containing a high concentration of phosphorus is formed on a glass substrate by a low-pressure CVD process which uses phosphine ($PH_3$) and silane ($SiH_4$) as raw-material gas. The poly-crystalline silicon is patterned to form the source and drain regions 301 and 302.

(B) Subsequently, silane is decomposed similarly by the low-pressure CVD process to form a poly-crystalline silicon thin film on the source and drain regions 302 and 301, to form the active layer 304. The active layer 304 is covered with the gate insulating film 305 consisting of a silicon dioxide film by a CVD process which uses silane and oxygen as raw-material gas.

(C) A pair of contact holes are formed in the silicon dioxide film 305, and the chromium 306 is formed on the silicon dioxide film 305 by a sputtering process.

(D) The chromium 306 is heat-treated at 200° C. to 300° C. Thus, the chromium silicide layer 308 is formed.

(E) The chromium 306 is patterned into a desirable configuration. Thus, the active matrix substrate is completed.

As will be seen from the foregoing, patterning steps using photomasks are a total of three (3) including the first n-type poly-crystalline silicon, the contact holes to the silicon dioxide, and the patterning of chromium.

Third Embodiment

Figure 5A:
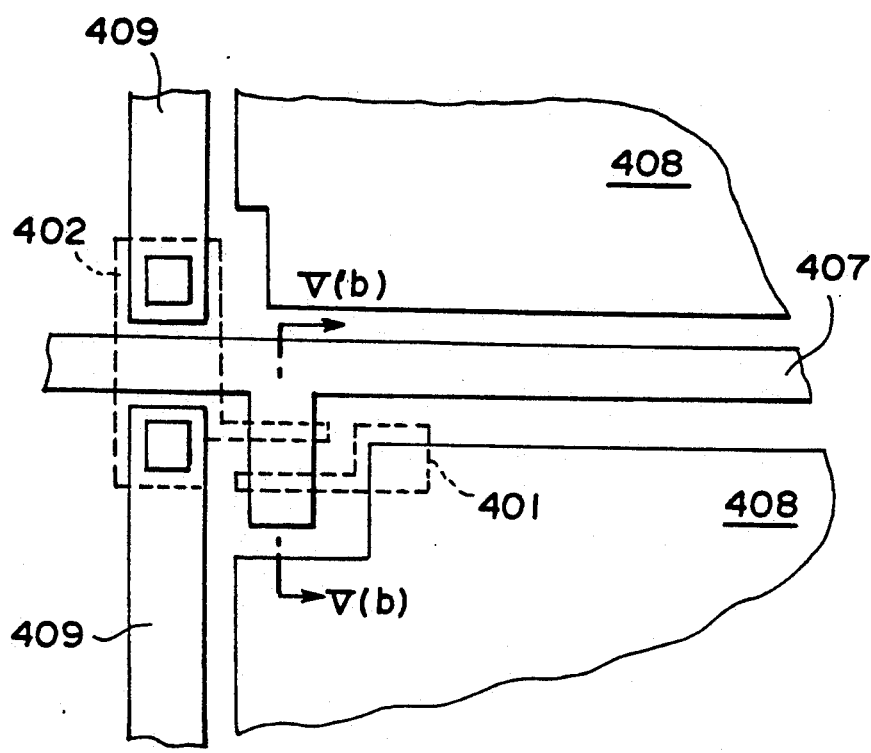
FIG. 5(a) is an enlarged fragmentary top plan view of an active matrix substrate for a liquid-crystal display, according to a third embodiment of the invention.
Figure 5B:
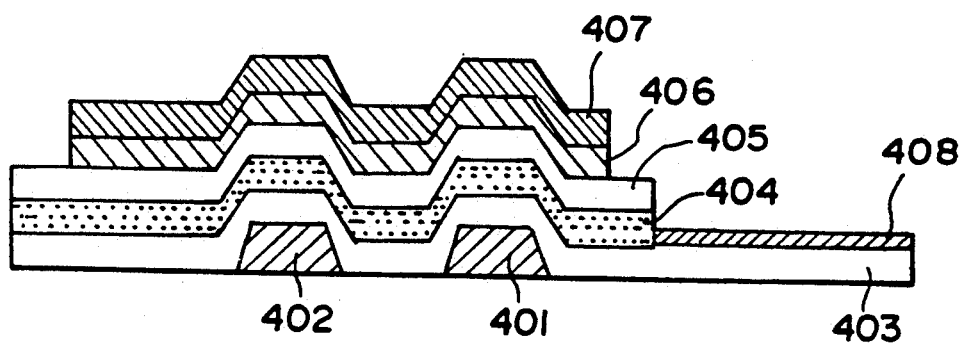
FIG. 5(b) is a cross-sectional view taken along the line V(b)—V(b) in FIG. 5(a)
Figure 6A:
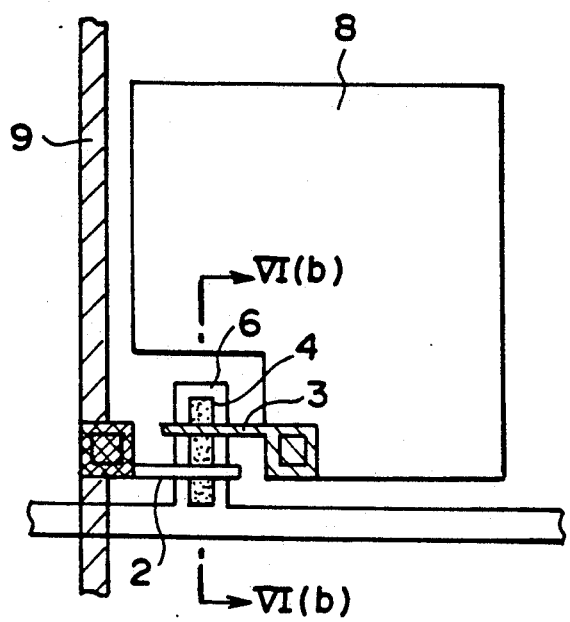
FIG. 6(a) is an enlarged fragmentary top plan view of the conventional active matrix substrate for a liquid-crystal display.
Figure 6B:
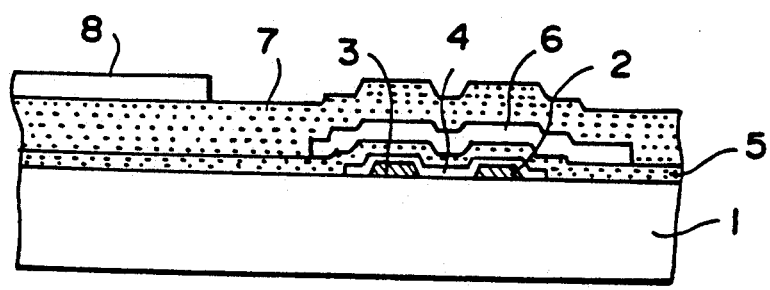
FIG. 6(b) is a cross-sectional view taken along the line VI(b)—VI(b) in FIG. 6(a)
Figure 7A:
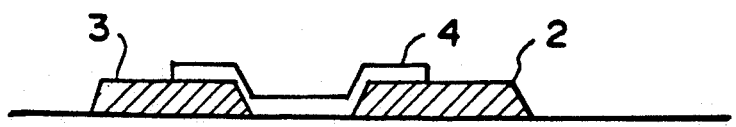
FIGS. 7(a) through 7(d) are views showing the conventional method of fabricating the active matrix substrate illustrated in FIGS. 6(a) and 6(b)
Figure 7B:
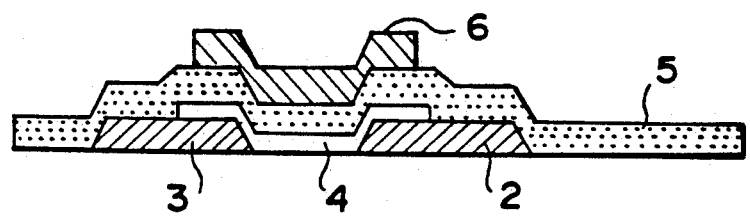
Figure 7C:
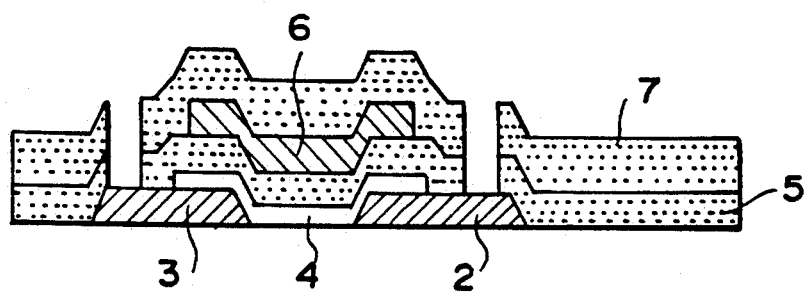
Figure 7D:
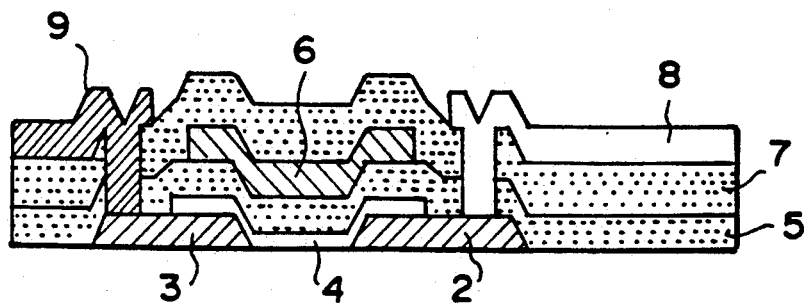

Referring next to FIGS. 5(a) and 5(b), there is shown, in top plan and cross-sectional views, an active matrix substrate for a liquid-crystal display, according to a third embodiment of the invention. FIG. 5(b) is a cross-sectional view taken along the line V(b)—V(b) in FIG. 5(a). The active matrix substrate comprises a source region 401 and a drain region 402 each of which is made of an n-type poly-crystalline silicon film. The source and drain regions 401 and 402 are covered with an active layer 403 which is made of a poly-crystalline silicon film and whose thickness is 300 Å. The active layer 403 is covered with double-layered gate insulating films 404 and 405 which are made respectively of a silicon dioxide film and a silicon nitride film. The gate insulating films 404 and 405 are covered with double-layered gate electrodes 406 and 407 which are made respectively of chromium and aluminum. Numeral 408 represents a chromium silicide film. A drain line 409 has its construction the same as that of the gate electrode.

Even if the active matrix substrate is arranged as in this embodiment, it is possible to shield leak current from the drain lines for other picture elements. Further, in this embodiment, each of the gate insulating films and the gate electrodes is formed by the double-layered films. The reason as to why the gate insulating films of double-layer construction is used is as follows. That is, the interface between the gate insulating film and the poly-crystalline silicon is formed by silicon dioxide which is low in trap-density. On the other hand, a silicon nitride film relatively large in dielectric constant is used on the silicon dioxide film, whereby the total thickness is increased so as to withstand short-circuiting defects caused such as by pin holes. Since the silicon nitride is formed within plasma including hydrogen, the hydrogen plasma treatment is practiced automatically. The reason as to why the gate electrode of double-layer construction is used is as follows. That is, the use of the aluminum at the upper section has such an advantage as to reduce the line resistance. These are likewise applicable also to the aforementioned first embodiment. In this manner, even if the double-layer films are used, the number of the masks is three (3).

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating an active matrix substrate for a liquid-crystal display having a plurality of individual transparent electrodes and a plurality of thin-film transistors both arranged in a matrix form, said method comprising the steps of:

forming a first silicon thin film in which impurities high in concentration are doped onto a transparent substrate, and patterning said first silicon thin film into source and drain regions;

forming a second silicon thin film on said source and drain regions, and patterning said second silicon thin film into a first island region which covers said source and drain regions and a second island region which is contiguous to said first island region and is slightly larger than the configuration of said transparent electrode;

forming an insulating film on said second silicon thin film;

forming in said insulating film at least a pair of contact holes over said source and drain regions, and a hole identical with the configuration of said individual transparent electrode on said second island region of said second silicon thin film;

forming a metal silicide by heat-treating said metal; and patterning said metal to form a gate, a source, and a drain line.

2. A method of fabricating an active matrix substrate for a liquid-crystal display having a plurality of individual transparent electrodes and a plurality of thin-film transistors both arranged in a matrix form, said method comprising the steps of:

forming a first silicon thin film in which high concentrations of impurities are doped onto a transparent substrate, and patterning said first silicon thin film into source and drain regions;

forming a second silicon thin film on said source and drain regions;

forming an insulating film on said second silicon thin film;

forming in said insulating film at least a pair of contact holes over said source and drain regions, and a hole identical with the configuration of said transparent electrode;

forming metal on said second silicon thin film, said metal reacting with at least silicon in order to form silicide;

forming a metal silicide by heat-treating said metal; and patterning said metal to form a gate, a source and a drain line.

* * * * *